(12) United States Patent
Ballam et al.

(10) Patent No.: US 10,480,962 B2
(45) Date of Patent: Nov. 19, 2019

(54) ELECTRONIC DEVICE INCLUDING A CAPACITIVE SENSOR IN A HOUSING

(71) Applicant: Capsule Technologies, Inc., San Diego, CA (US)

(72) Inventors: Robert Ballam, Eatons Hill (AU); Robert Ganton, San Diego, CA (US)

(73) Assignee: CAPSULE TECHNOLOGIES, INC., San Diego, CA (US)

( * ) Notice: Subject to any disclaimer, the term of this patent is extended or adjusted under 35 U.S.C. 154(b) by 191 days.

(21) Appl. No.: 15/493,538

(22) Filed: Apr. 21, 2017

(65) Prior Publication Data

US 2018/0306603 A1     Oct. 25, 2018

(51) Int. Cl.
*G01D 5/24*     (2006.01)
*G01V 3/08*     (2006.01)
(Continued)

(52) U.S. Cl.
CPC ....... *G01D 5/2405* (2013.01); *G01R 27/2605* (2013.01); *G01V 3/08* (2013.01);
(Continued)

(58) Field of Classification Search
CPC .. G01D 5/00; G01D 5/12; G01D 5/14; G01D 5/24; G01D 5/2405; G01D 5/241; G01D 5/2412; G01D 5/2417; G01R 27/26; G01R 27/2605; H03K 17/00; H03K 17/94; H03K 17/945; H03K 17/955; H03K 2217/960755; G01V 3/00; G01V 3/08

(Continued)

(56) References Cited

U.S. PATENT DOCUMENTS 5,585,810 A * 12/1996 Tsuru ............. H01Q 9/0421
                                                    343/700 MS
5,650,729 A *  7/1997 Potter ............ H03K 17/955
                                                         324/660
(Continued)

FOREIGN PATENT DOCUMENTS

EP     2276109 A1    1/2011
GB     2487579 A     8/2012

OTHER PUBLICATIONS

International Search Report and Written Opinion—PCT/US2018/027788—ISA/EPO—dated Jul. 19, 2018 (10 pages).

*Primary Examiner* — Hoai-An D. Nguyen
(74) *Attorney, Agent, or Firm* — Kilpatrick Townsend & Stockton LLP

(57) ABSTRACT

Disclosed are electronic devices for detecting contact or close proximity to an object to be detected. An electronic device includes a capacitive sensor enclosed by a housing and a controller coupled to the capacitive sensor, where the controller is configured to detect contact or close proximity to an object to be detected, and where the capacitive sensor includes a capacitor with a sensor electrode. The sensor electrode is separated from an outer surface of the housing by the housing. At least a portion of the housing includes a partially conductive material and the sensor electrode is in conductive contact with the partially conductive material, or the sensor electrode is in conductive contact with an electrically conductive element on an inner surface of the housing or at least partially embedded in the housing.

22 Claims, 8 Drawing Sheets

(51) Int. Cl.
 *G01R 27/26* (2006.01)
 *H03K 17/955* (2006.01)

(52) U.S. Cl.
 CPC .......... *H03K 17/955* (2013.01); *G01R 27/26* (2013.01); *H03K 2217/960755* (2013.01)

(58) Field of Classification Search
 USPC ....... 324/600, 649, 658, 661, 662, 663, 671, 324/686, 691; 702/47, 52; 345/173, 174
 See application file for complete search history.

(56) References Cited

U.S. PATENT DOCUMENTS

| | | | |
|---|---|---|---|
| 6,442,013 B1 | 8/2002 | Lindgren et al. | |
| 8,874,324 B2 | 10/2014 | Eggers et al. | |
| 9,429,608 B2 | 8/2016 | Magnusson et al. | |
| 9,496,602 B2 | 11/2016 | Kasar et al. | |
| 2002/0060953 A1* | 5/2002 | Farine | G04C 3/14 368/69 |
| 2007/0146122 A1* | 6/2007 | Ratner | G08B 3/10 340/286.06 |
| 2010/0020469 A1* | 1/2010 | Kurioka | H01G 4/018 361/321.1 |
| 2010/0187216 A1* | 7/2010 | Komada | H03K 17/962 219/443.1 |
| 2011/0043227 A1 | 2/2011 | Pance et al. | |
| 2013/0335376 A1* | 12/2013 | Lee | G06F 3/0416 345/174 |
| 2015/0185908 A1 | 7/2015 | Reinle et al. | |
| 2016/0329893 A1* | 11/2016 | Airoldi | H03K 17/955 |

\* cited by examiner

ELECTRONIC DEVICE INCLUDING A CAPACITIVE SENSOR IN A HOUSING

TECHNICAL FIELD

This disclosure relates generally to detecting contact or proximity to an object using a capacitive sensor of an electronic device, and more particularly, to detecting contact or proximity to an object using a capacitive sensor enclosed by a housing having a portion that is at least partially conductive or having an electrically conductive element.

DESCRIPTION OF RELATED TECHNOLOGY

Electronic devices, including wearable medical devices or patches, may include various electronic components for biometric and biomedical applications. For example, an electronic sensor patch may be configured to transmit signals indicative of a sensed state, condition, or quantity. The signals generated by the electronic sensor patch may be processed to measure one or more detectable physical quantities based on a correlation between the signal and the underlying physical quantity. Non-limiting examples of sensors that may be implemented in an electronic sensor patch include temperature sensors, pulse sensors, electric field sensors (e.g., electroencephalograph sensors), moisture sensors, liquid flow sensors, magnetic sensors, piezoelectric sensors, pressure sensors, optical sensors, chemical sensors (e.g., blood glucose sensors), and other biomedical sensors.

Many electronic devices require a battery such that power management of the battery needs to be strategically controlled. Power management of the electronic device is important when the electronic device is not in active use, such as when the electronic device is being manufactured (e.g., factory mode) or stored (e.g., shelf mode). Power can be strategically managed to conserve battery life during factory and shelf modes and function in a low-power mode. Challenges in power management of electronic devices include proper detection of when the electronic device is in active use and no longer in a factory mode or shelf mode. Additional challenges in power management exist for detecting activation and proper use or installation of various components of the electronic device.

In many conventional electronic devices, an on/off switch can be provided to determine when the electronic device has been activated. However, an on/off switch may be inadvertently turned on that results in wasteful consumption of battery life, and an on/off switch may be inadvertently turned off to defeat the function of the electronic device. For example, an electronic patch may be inadvertently turned off to defeat the diagnostic function of the electronic patch. If electronic devices are packaged in the "on" position, battery life can be consumed quickly and the lifetime of the electronic device can be limited.

Sensors may be used with the electronic devices to determine if the electronic devices have been unpackaged, installed, placed on, or in use with a person. Determining that electronic devices are in use can provide valuable information for various purposes. Capacitance sensor technology may be used to determine if the electronic devices have met one or more specified conditions. Determining that the electronic devices are in use can provide valuable information, and determining that the electronic devices are not in use can trigger reduction in power consumption.

SUMMARY

The devices of this disclosure each have several aspects, no single one of which is solely responsible for the desirable attributes disclosed herein.

One aspect of the subject matter of this disclosure can be implemented in an electronic device. The electronic device includes a capacitive sensor including a capacitor having at least one sensor electrode, a controller coupled to the capacitive sensor, and a housing that encloses the capacitive sensor and having an inner surface and an outer surface opposite the inner surface. The controller is configured to determine whether the electronic device is in contact or in close proximity to an object based at least in part on a rate of capacitance charge of the capacitor when the capacitive sensor is energized. At least a first portion of the housing includes an electrically insulating material and at least a second portion of the housing includes a partially conductive material, where the at least one sensor electrode is in conductive contact with the second portion of the housing and separated from the outer surface by the housing.

In some implementations, the at least one sensor electrode is disposed on the inner surface of the housing. In some implementations, the capacitive sensor further includes a resistor electrically connected in series with the capacitor, where the controller is configured to apply a signal to the resistor to energize the capacitive sensor. In some implementations, an electrical resistance of the resistor is at least five times greater than an electrical resistance of the partially conductive material of the second portion of the housing. In some implementations, the partially conductive material of the second portion of the housing has an electrical resistance equal to or less than $1 \times 10^5 \Omega$ and the resistor has an electrical resistance equal to or greater than $5 \times 10^5 \Omega$. In some implementations, the controller includes a processor having a clock rate that is less than about 100 Megahertz. In some implementations, the partially conductive material of the second portion of the housing includes carbon-impregnated plastic.

Another innovative aspect of the subject matter described in this disclosure can be implemented in an electronic device. The electronic device includes a capacitive sensor including a capacitor having at least one sensor electrode, a controller coupled to the capacitive sensor, a housing that encloses the capacitive sensor and having an inner surface and an outer surface opposite the inner surface, and an electrically conductive element disposed on the inner surface of the housing and in conductive contact with the at least one sensor electrode. The controller is configured to determine whether the electronic device is in contact or in close proximity to an object based at least in part on a rate of capacitance charge of the capacitor when the capacitive sensor is energized. The housing includes an electrically insulating material, where the at least one sensor electrode is separated from the outer surface by the housing.

In some implementations, the electrically conductive element has a surface area greater than a surface area of the at least one sensor electrode. In some implementations, the electrically conductive element is an electrically conductive paint coated on the inner surface of the housing. In some implementations, the capacitive sensor further includes a resistor electrically connected in series with the capacitor, where the controller is configured to apply a signal to the resistor to energize the capacitive sensor.

Another innovative aspect of the subject matter described in this disclosure can be implemented in an electronic device. The electronic device includes a capacitive sensor including a capacitor having at least one sensor electrode, a controller coupled to the capacitive sensor, a housing that encloses the capacitive sensor and having an inner surface and an outer surface opposite the inner surface, and an electrically conductive element at least partially embedded in the housing and electrically connected to the at least one sensor electrode. The controller is configured to determine whether the electronic device is in contact or in close proximity to an object based at least in part on a rate of capacitance charge of the capacitor when the capacitive sensor is energized. The housing includes an electrically insulating material, where the at least one sensor electrode is separated from the outer surface by the housing.

In some implementations, the electrically conductive element has a surface area greater than a surface area of the at least one sensor electrode. In some implementations, the electrically conductive element is closer to the outer surface of the housing than the at least one sensor electrode. In some implementations, the capacitive sensor further includes a resistor electrically connected in series with the capacitor, where the controller is configured to apply a signal to the resistor to energize the capacitive sensor.

BRIEF DESCRIPTION OF THE DRAWINGS

The accompanying drawings, which are incorporated herein and constitute part of this specification, illustrate exemplary embodiments of the claims, and together with the general description given above and the detailed description given below, serve to explain the features of the claims.

Like reference numbers and designations in the various drawings indicate like elements.

DETAILED DESCRIPTION

Figure 1:
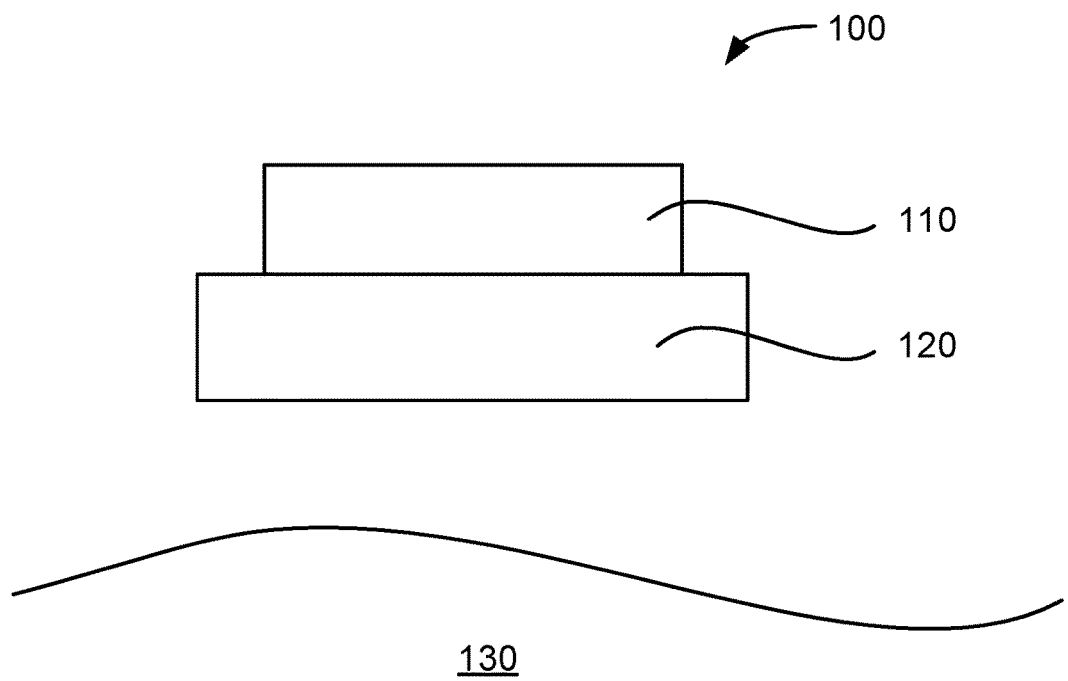
FIG. 1 is a schematic representation of an example electronic device including a housing and a base according to some implementations.

Various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

The described implementations may be implemented in any device, apparatus, or system that includes a sensor system. As used herein, an "electronic device" and "electronic sensor device" may be used interchangeably. In some implementations, the electronic device may be a biomedical or biometric device. In some implementations, the electronic device may be a wearable device, such as an electronic patch worn by a user. Non-limiting examples of wearable devices include patches, bracelets, armbands, wristbands, rings, headbands, belts, etc. The electronic device can include one or more sensors for sensing or measuring detectable physical phenomena or quantities. The one or more sensors may be used to take readings or measurements of a patient's body, for example. The electronic device may be configured to transmit signals indicative of a measurement or sensed state, condition, or quantity. The signals generated by a sensor may be processed to measure the detectable physical phenomena or quantities based on a correlation between the signal and the underlying physical phenomenon or quantity. Non-limiting examples of sensors that may be implemented in an electronic device include temperature sensors, pulse sensors, electric field sensors (e.g., electroencephalograph sensors), moisture sensors, liquid flow sensors, magnetic sensors, piezoelectric sensors, pressure sensors, optical sensors, chemical sensors (e.g., blood glucose sensors), etc.

The present disclosure relates generally to systems or devices with capacitive sensors enclosed by a housing. When device constraints limit a size of a capacitive sensor, such as having a small sensor area, the range of capacitance change is small and the sensing resolution is small. In addition, a housing separates the capacitive sensor between a sensor electrode of the capacitive sensor and an object to be detected, which reduces the sensitivity and range of the capacitive sensor.

An electronic device of the present disclosure includes a capacitive sensor and a housing. The capacitive sensor is configured to detect contact or close proximity to an object, where the capacitive sensor includes a sensor electrode. The housing encloses the capacitive sensor and separates the sensor electrode from an outer surface. The housing includes a portion made out of partially conductive material or has an electrically conductive element on an inner surface of the housing or at least partially embedded in the housing. In some implementations, the sensor electrode has a small geometry, such as a surface area between about nine square millimeters and about 225 square millimeters. In some implementations, a thickness of the housing that separates the sensor electrode from the outer surface is large enough to influence the sensing resolution of the capacitive sensor, such as a thickness between about 0.5 millimeters and about five millimeters.

Particular implementations of the subject matter described in this disclosure can be implemented to realize one or more of the following potential advantages. With capacitive sensors having small geometries, electronic devices can be packaged to small sizes to meet device constraints and reduce burden to a user. Enclosure within a sufficiently thick housing provides structural support and protection from the environment or external forces. A housing with a partially conductive portion or with an electrically conductive element increases the sensitivity of the capacitive sensor by effectively increasing the sensor electrode size and/or effectively extending the sensor electrode closer to an outer surface of the housing. The increase in sensitivity increases the range over which an object can be detected without the burden of increasing the size of the capacitive sensor or reducing the thickness of the housing. Moreover, the increase in sensitivity can be achieved without the burden of increasing a speed (e.g., frequency) of a processor, which would otherwise add to power consumption of the electronic device. In some implementations, where the electronic device includes multiple capacitive sensors or sensor electrodes close together, the sensor electrodes may overlap one another and cause issues in identifying one region from another. However, by effectively extending sensor electrodes closer to an outer surface of a housing, interactions between adjacent capacitive sensors can be reduced while maintaining reasonable performance of the capacitive sensors.

FIG. 1 is a schematic representation of an example electronic device including a housing and a base. An electronic device 100 may be configured to detect when an object 130 is nearby. In some implementations, the electronic device 100 may be applied to a patient, such as on skin of a patient's body. The electronic device 100 in FIG. 1 includes a housing 110 and a base 120 disposed on the housing 110, where the base 120 can be disposed on a side of the housing 110 facing the object 130. The housing 110 can serve as part of an electronic package that includes various circuitry, electronic components, sensors, and control systems. In some implementations, the housing 110 may enclose a circuit board and a sensor, where the circuit board includes a controller and where the sensor includes a capacitive sensor. The capacitive sensor may be configured to determine whether the electronic device 100 is in close proximity to or in contact with an object 130, such as a patient's body. Other sensors may assist in measuring detectable physical phenomena or other quantities, such as temperature, pulse rate, blood pressure, blood glucose levels, etc. A base 120 may be disposed on the housing 110, or vice versa, and may be capable of being detached from the housing 110. In some implementations, the base 120 can serve as a protective layer or cover for the housing 110. In some implementations, the base 120 includes electrically insulating material. For example, a user may grip the housing 110 and apply a removal force to remove the housing 110 from the base 120.

In some implementations, the electronic device 100 is an electronic patch or electronic sensor patch. The electronic patch may be suitable for performing various biometric or biomedical applications. The housing 110 in such implementations may be peeled off from the base 120, or the base 120 may be peeled off from the housing 110. A side of the housing 110 is exposed and may be affixed to the object 130, such as a patient's body, after removal of the base 120 from the housing 110. One or more sensors in the electronic device 100 may be configured to detect when the base 120 has been removed and when the housing 110 of the electronic device 100 has been affixed to the object 130. For instance, removal of the base 120 from the housing 110 may cause the electronic device 100 to transition from a low-power mode (e.g., shelf mode) to a high-power mode (e.g., active mode).

In some implementations, the electronic device 100 is not limited to an electronic patch or electronic sensor patch, but is any electronic device 100 that may be applied to or used for detecting proximity to an object 130. For example, the electronic device 100 is a device capable of biometric or biomedical functions, such as a glucometer, EKG monitor, blood pressure monitor, temperature sensor, or other device. Regardless of the shape, size, or structure of the electronic device 100, one or more sensors in the electronic device 100 may be capable of detecting when the electronic device 100 is in close proximity to or in contact with the object 130.

In some implementations, the housing 110 may include one or more capacitive sensors covered by the base 120. Typically, the base 120 may cover the one or more capacitive sensors so that they would not be triggered by routine handling or inadvertent pressing. Once the base 120 is removed from the housing 110, then the housing 110 may be affixed to the object 130 and the one or more capacitive sensors can detect whether the electronic device 100 is in contact with the object 130. Alternatively, the base 120 covering a side of the housing 110 facing the object 130 is not removed but may remain on the housing 110. A surface of the base 120 facing the object 130 may attach to the object 130 while the base 120 covers the one or more capacitive sensors. The one or more capacitive sensors can detect whether the electronic device 100 is at least in close proximity to the object 130 with the base 120 in place.

In some implementations, one or both of the housing 110 and the base 120 are rigid. For example, the housing 110 of the electronic device 100 may be rigid. In some implementations, one or both of the housing 110 and the base 120 are flexible. For example, the housing 110 of the electronic device 100 may be flexible. In some implementations, one or both of the housing 110 and the base 120 are semi-rigid. For example, the housing 110 of the electronic device 100 may be semi-rigid. If one or both of the housing 110 and the base 120 are rigid or semi-rigid, advantages of lower costs and ease of manufacturing may be achieved. Having one or both of the housing 110 and the base 120 be rigid or semi-rigid can allow other parts of the electronic device 100 to also be rigid or semi-rigid, thereby simplifying assembly of the electronic device 100. If one or both of the housing 110 and the base 120 are flexible, an advantage of more effective adherence of the electronic device 100 to the object 130 may be achieved.

Figure 2:
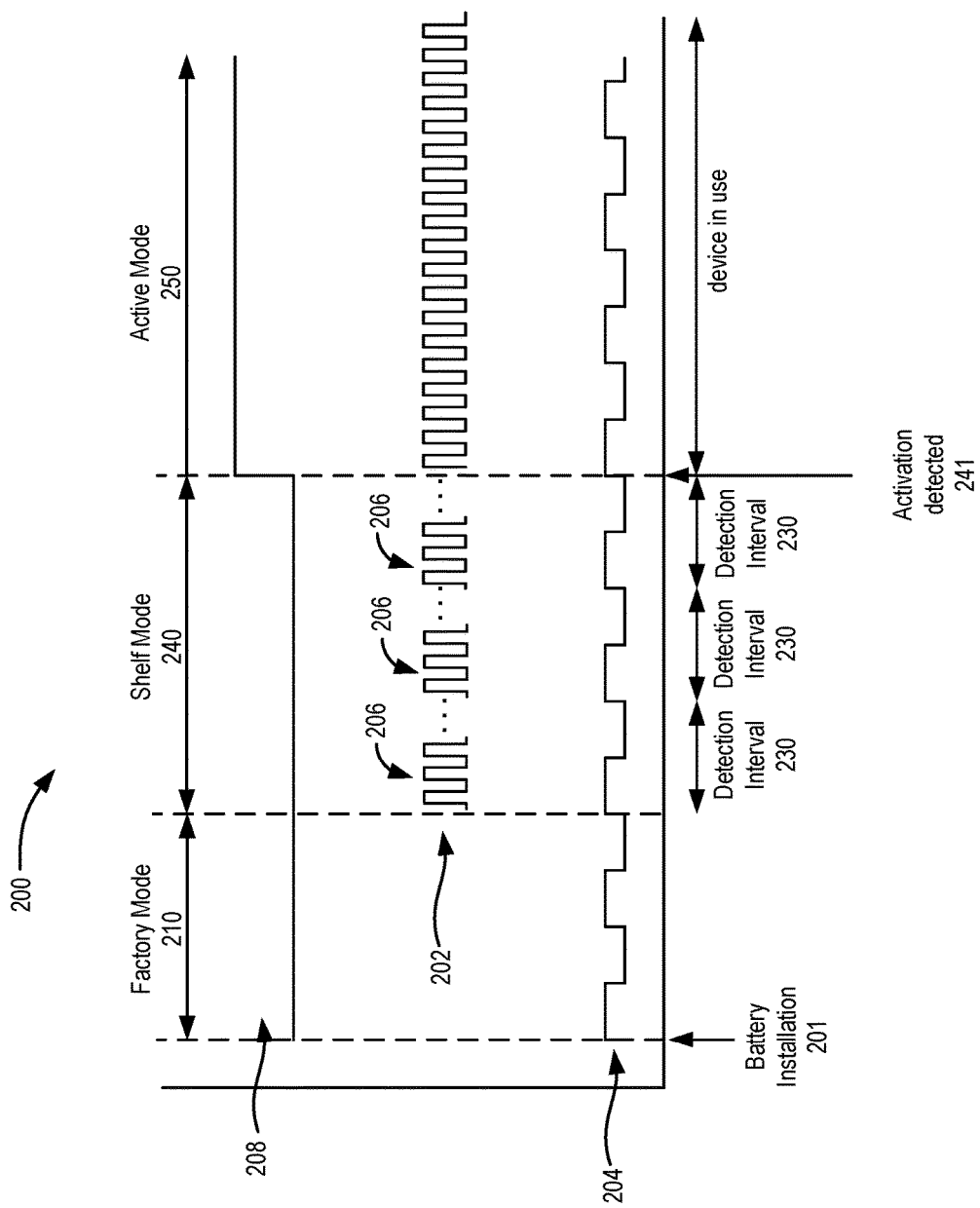
FIG. 2 is a timing diagram illustrating power consumption of various electronic components of an electronic device during a factory mode, a shelf mode, and an active mode according to some implementations.

An electronic device 100 may be capable of operating in different modes or power states to manage consumption of power. The electronic device 100 may transition from one mode to another depending on if certain conditions are met, such as whether certain timing conditions or attachment conditions are met. Different modes or power states can add greater range and flexibility for power management of the electronic device 100. By way of an example, the electronic device 100 can have a low-power mode and a high-power mode, or the electronic device 100 can have two or more of a lowest-power mode, a low-power mode, a high-power mode, and a highest-power mode. As shown in FIG. 2, an electronic device can have a lowest-power mode (e.g., factory mode), a low-power mode (e.g., shelf mode), and a high-power mode (e.g., active mode). It will be understood that the electronic device with two or more power states can have other power states. In one example, the electronic device can have an ultra low-power mode, a low-power mode, and a high-power mode. In some implementations, the ultra low-power mode can be the shelf mode. The electronic device may modulate between an active mode and a low-power mode in such instances, where the electronic device at its low-power mode operates at a higher power than its shelf mode. In another example, the electronic device can have a low-power mode and a high-power mode, where the shelf mode and the low-power mode are identical.

FIG. 2 is a timing diagram illustrating power consumption of various electronic components of an electronic device during a factory mode, a shelf mode, and an active mode according to some implementations. However, it will be understood that the electronic device is not limited to the aforementioned modes of operation or power states, but may have different, fewer, or more modes of operation or power states. A factory mode 210 may be a transient mode that allows for configuration, assembly, and/or testing of an electronic device. During a shelf mode 240, the electronic device is "active" in monitoring for certain conditions to be met, but operating in a low-power state to extend the shelf life of the electronic device. When the electronic device transitions from the shelf mode 240 to an active mode 250, the electronic device becomes fully operational.

To accomplish power management, a timing diagram 200 tracks power usage of certain components in the electronic device as the electronic device transitions between different modes 210, 240, and 250. In some implementations, the factory mode 210 may be established that represents a duration of time in the manufacturing process. For example, the factory mode 210 may be established from application of power, such as when a battery is installed at battery installation 201, and may continue until manufacturing, assembly, testing, and packaging is complete. Prior to the factory mode 210, the electronic device may be operating at an even lower power in which all components, including clocks and peripheral electronic components, are turned off. During the factory mode 210, a controller may begin operation of a low-power clock 204. All other components, including a high-power clock and peripheral electronic components, are turned off. The low-power clock 204 allows the controller to know the elapsed time since activation (e.g., battery installation 201) and to track a remaining time for the factory mode 210. When the factory mode 210 expires, the electronic device transitions to a shelf mode 240 in which detection operations are periodically performed. In the shelf mode 240, the electronic device can use the low-power clock 204 to periodically "wake up" one or more sensors to determine if the electronic device meets specified conditions, such as if the electronic device has been applied or attached.

A detection interval 230 may represent a brief interval of time in which one or more sensors sense whether specified conditions are met by the electronic device. The detection interval 230 may be performed cyclically until the electronic device meets the specified conditions. In some implementations, the detection interval 230 may range from a few seconds to a few minutes, such as between about one second and about sixty seconds. In other implementations, the detection interval 230 may be shorter or longer. The detection interval 230 may be set in order to optimize the responsiveness of the finished electronic device product. For example, the detection interval 230 may be set to optimize the length of a low-power state to preserve battery life, while providing a relatively short sensing interval for improved responsiveness.

During the detection interval 230, the controller may be configured to perform a check of the one or more sensors to determine if the specified conditions are met. In one example, a high-power clock 202, such as a full duty cycle clock, may be enabled for a period of time sufficient to complete detection operations. The high-power clock 202 may generate a full duty clock signal 206 for a sufficiently short period of time to detect if the specified conditions are met while having a minimal effect on power. The sufficiently short period of time of the full duty clock signal 206 may be in the range of a few microseconds to a few milliseconds, such as less than about ten microseconds. During the full duty clock signal 206, the controller and one or more sensors may perform a detection operation or reading. The one or more sensors may generate a signal to be received by the controller. In some implementations, the one or more sensors may include a capacitive sensor that generates a signal indicating a rate of capacitance charge when the capacitive sensor is charged. This can be done by calculating capacitance from a time constant or by inferring the capacitance by changes in the amount of rise time associated with the signal. A longer charge cycle is generally associated with being in contact with a person or in close proximity to a person's skin. Upon receiving the signal indicating the rate of capacitance charge from the one or more sensors, the controller can determine if the specified conditions for detection are met. If the specified conditions are not met, the high-power clock 202 is disabled, and the one or more sensors and/or the controller return to sleep. In other words, the one or more sensors and/or the controller are disabled or turned off until the next detection interval 230. The low-power clock 204 continues to operate to periodically wake up the one or more sensors from sleep. If the specified conditions are met, the full capabilities of the electronic device may be turned on, including peripheral electronic components.

Determining that the specified conditions are met to transition from the shelf mode 240 to the active mode 250 may occur in response to activation detection 241. One or more sensors may be employed to determine if the electronic device is in close proximity to or in contact with a body, and validate that the electronic device is properly installed, activated, or in use. During the active mode 250, all sensors associated with the electronic device and peripheral electronic components may be activated. Sensors associated with the electronic device and peripheral electronic components may be activated sequentially according to a validation sequence using multiple sensors. Sensing components and wireless communications components 208 (e.g., radio-frequency modules) may be activated during the active mode 250. Furthermore, the high-power clock 202 may operate continuously or as may be called for under the control of the controller to perform sensor readings and to transmit the sensor readings to another device. The full operations of the electronic device may be available during the active mode 250. In some implementations, the low-power clock 204 may continue to be in use as shown in FIG. 2, or may be optionally disabled. The low-power clock 204 may monitor quantities like remaining battery charge state or remaining time-to-live. In some implementations, the electronic device may be removed from the body, taken away from close proximity to the body, uninstalled, deactivated, or removed from use. Under such conditions, the electronic device may return to a low-power mode or shelf mode 240. Alternatively or additionally, the electronic device may provide an alert or notification to another device, such as a smartphone, cloud server, or other remote device.

In some implementations, the electronic device may be provided with a total active life parameter, which may be influenced by quality or other factors. The total active life parameter may be in the form of a timer value, which, like other timer values, may be counted down by operation of the low-power clock 204. In some implementations, the total active life parameter may be counted down during the various modes 210, 240, and 250, such as during the shelf mode 240 and the active mode 250. When the total active life timer indicates that the electronic device is reaching the end of its active life, the electronic device may alert a user. In some implementations, the alert may indicate that the electronic device should be removed or replaced.

Figure 3A:
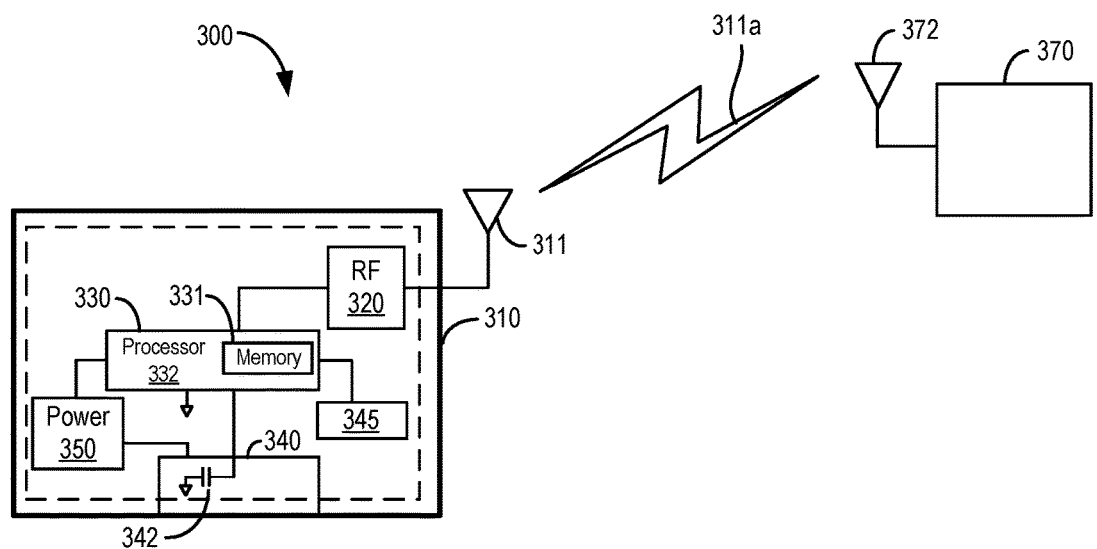
FIG. 3A is a block diagram representation of an example electronic device in communication with a remote device according to some implementations.

FIG. 3A is a block diagram representation of an example electronic device in communication with a remote device according to some implementations. An electronic device 300 can include an antenna 311, a wireless communications component 320, a controller 330, a capacitive sensor 340 for detecting a specified condition of the electronic device 300, one or more sensors 345, and a power supply 350. Some or all of the components may be enclosed by a housing 310. As shown by the dotted line, some or all of the components of the electronic device 300 may be enclosed, encapsulated, or sealed to provide environmental protection. In some implementations, the electronic device 300 may be configured to operate in a variety of environmental conditions including wet conditions. Some or all of the components of the electronic device 300, such as the controller 330 and the wireless communications component 320, may be provided as individual components or may be integrated into a single device. The components of the electronic device 300 may be sealed or encapsulated to allow operation when at least partially submerged in water or other liquids.

In some implementations, the wireless communications component 320 includes a transmitter or transceiver to conduct one-way or two-way radio-frequency (RF) communication. The wireless communications component 320 may be an RF module that includes base band, intermediate and transmit frequency modules and encoders. The RF module may operate in one or more of a number of RF bands depending on the type of communications supported by the configuration of a remote device 370. The wireless communications component 320 may be coupled to the controller 330 and coupled to the antenna 311. The antenna 311 of the electronic device 300 may be configured to establish wireless communication with an antenna 372 of the remote device 370 via a wireless communication link 311a. Sensor data or readings from the one or more sensors 345 may be transferred from the electronic device 300 to another device. In addition, feedback regarding detection operations of the electronic device 300 may be communicated to the remote device 370, and the remote device 370 may be configured to provide instructions to the electronic device 300. For example, as the remote device 370 receives feedback regarding detection conditions being met by the electronic device 300, the remote device 370 may communicate a sequence of instructions for fully activating the electronic device 300. Thus, if the remote device 370 receives feedback that the capacitive sensor 340 detects a specified condition, then the remote device 370 may instruct a user to handle the electronic device 300 in an appropriate manner to fully activate the electronic device 300. Though not shown in FIG. 3A, the electronic device 300 may be equipped with additional sensors for detecting additional conditions, such as a first sensor for detecting a first condition, a second sensor for detecting a second condition, a third sensor for detecting a third condition, a fourth sensor for detecting a fourth condition, a fifth sensor for detecting a fifth condition, and so on. The first condition, second condition, third condition, and so forth can include conditions such as contact with a body, close proximity to a body, application of a needle, application of an electrode of an EKG monitor, pressing of a button, and detachment of a base, among other conditions. In some implementations, the remote device 370 is a smartphone, a cloud server, or any other device having cellular communication capability.

The controller 330 of the electronic device 300 may be capable of performing some or all of the methods described herein. The controller 330 may be used interchangeably with a "control unit," "control system," "microcontroller," or "processing unit." The controller 330 may include a processor 332 and a memory 331. The processor 332 may be a single or multi-core processor, which may be general purpose or specifically adapted for use in the electronic device 300. The memory 331 of the controller 330 may be volatile or non-volatile memory (e.g., flash memory) or a combination thereof. The memory 331 may provide instructions to the controller 330.

The one or more sensors 345 may be capable of sensing or measuring detectable physical phenomena or quantities, such as taking readings or measurements of a patient's body. Examples of the one or more sensors 345 may include temperature sensors, pulse sensors, electric field sensors (e.g., electroencephalograph sensors), moisture sensors, liquid flow sensors, magnetic sensors, piezoelectric sensors, pressure sensors, optical sensors, chemical sensors (e.g., blood glucose sensors), etc. However, it will be understood that in some implementations the electronic device 300 may not be equipped with any of the one or more sensors 345.

The controller 330, the capacitive sensor 340, the wireless communications component 320, and any other electronic component of the electronic device 300 may be powered by the power supply 350. In some implementations, the power supply 350 is a battery. The battery may be any suitable battery of sufficient power to energize various circuits associated with the electronic device 300 over the projected lifetime of the electronic device 300. For example, the battery can be a standard watch or coin cell battery.

The capacitive sensor 340 is capable of having an effective capacitance and resistance. The capacitive sensor 340 includes a capacitor 342 and a resistor 344. Other sensors may be included in the electronic device 300. For example, the electronic device 300 may further include a bioimpedance sensor that is capable of directly measuring the ohmic impedance of the skin of a patient's body to determine detection of skin. In another example, the electronic device 300 may further include an EKG electrode that is capable of using capacitive sensing or directly measuring impedance between two or more electrodes to determine if the electronic device 300 has been properly installed. In yet another example, the electronic device 300 may further include a glucose monitor needle or sense wires to determine if a portion of the electronic device 300 has been injected into the skin of a patient's body. In still yet another example, the electronic device 300 may further include a mechanical switch capable of being pressed by a user.

Figure 3B:
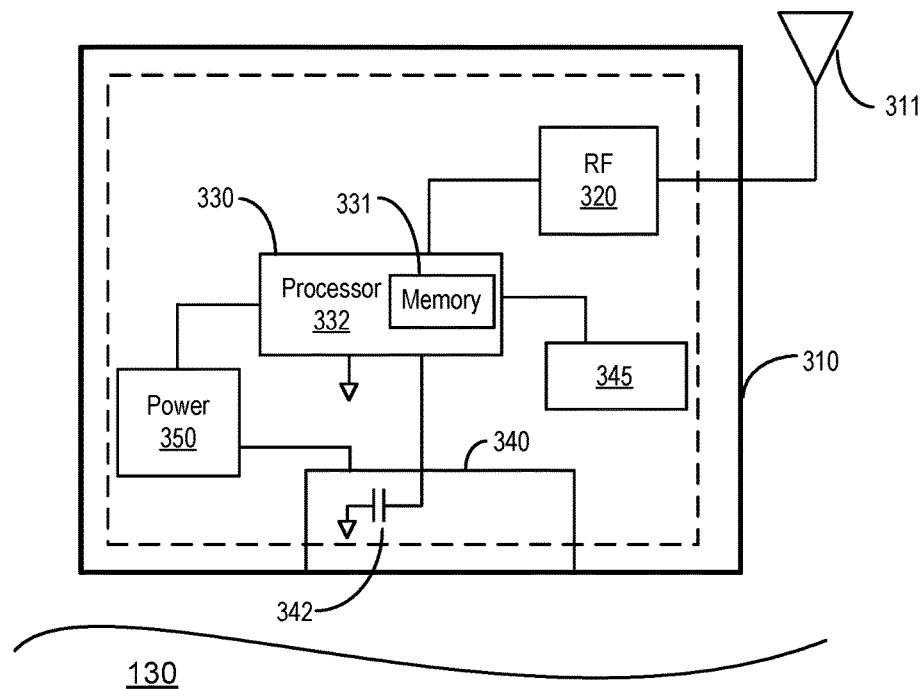
FIG. 3B is a block diagram representation of an example electronic device in proximity to an object according to some implementations.

FIG. 3B is a block diagram representation of an example electronic device in proximity to an object according to some implementations. The capacitive sensor 340 is configured to detect whether the electronic device 300 is in contact or in close proximity to an object 130. The capacitive sensor 340 may be able to differentiate between an inanimate object and a living organism, such as a person. Generally, inanimate objects are not conductive enough to trigger the capacitive sensor 340. Moreover, the controller 330 may be trained to detect the body of a person when the person is essentially in direct physical touch with the electronic device 300. In some implementations, detection thresholds and sensor geometry may be adjusted so that detection of being in close proximity to the object 130 means that the electronic device 300 is very close to the object 130 or almost touching the object 130. In some implementations, close proximity to the object 130 refers to a distance of equal to or less than about ten millimeters, equal to or less than about five millimeters, equal to or less than about two millimeters, or equal to or less than about one millimeter between the object 130 and the electronic device 300. There can be some distance between the capacitive sensor 340 and the object 130 to allow for a thickness of the housing 310. Sensitivity and detection thresholds can be adjusted so that once the housing 310 is taken into account, essentially direct physical contact with the electronic device 300 can trigger detection of the electronic device 300. Thus, close proximity to the object 130 can still mean that the electronic device 300 is contacting the object 130 when accounting for device requirements that may separate the capacitive sensor 340 from the object 130 (e.g., thickness of the housing 310).

Figure 3C:
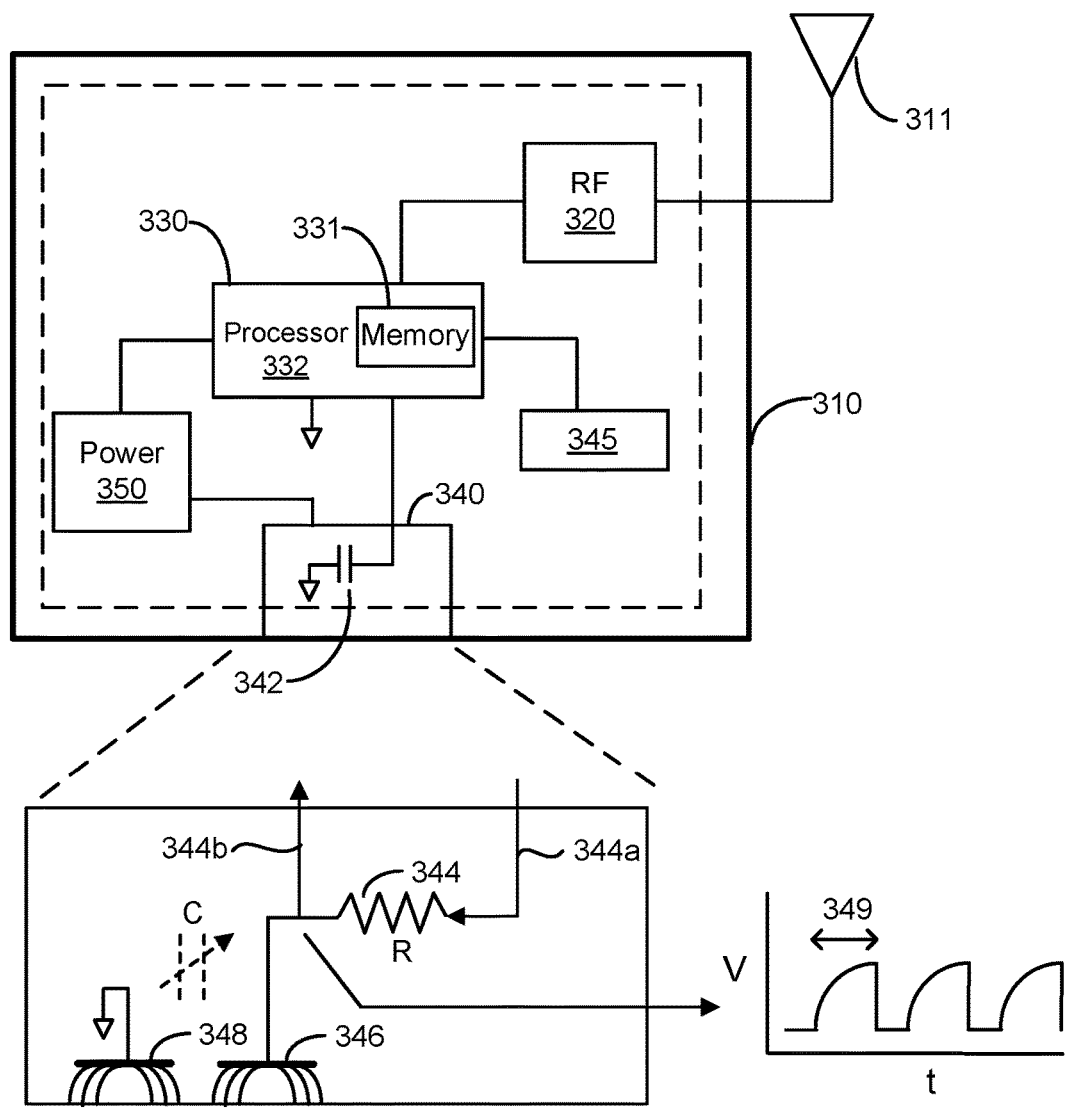
FIG. 3C is a block diagram representation of an example electronic device with a circuit diagram and a timing diagram for a capacitive sensor of the electronic device according to some implementations.

FIG. 3C is a block diagram representation of an example electronic device with a circuit diagram and a timing diagram for a capacitive sensor of the electronic device according to some implementations. A capacitor 342 of the first sensor 340 may include one or more conductive surfaces 346, 348. While the one or more conductive surfaces 346, 348 may appear as conductive pads, the conductive surfaces may take on a variety of shapes, sizes, and structures. The different shapes, sizes, and structures of the one or more conductive surfaces 346, 348 may optimize contact of the electronic device 300 over a wide area to increase the likelihood of detection.

The capacitive sensor 340 may have an effective capacitance C and a resistance R. In some implementations, a resistor 344 providing the resistance R is optional, because a current source may drive the capacitive sensor 340. Also, in some implementations, the resistor 344 and the one or more conductive surfaces 346, 348 may be other components that are functionally equivalent to capacitors and resistors or that provide similar responses to a touch signal applied to the one or more conductive surfaces 346, 348. The illustrated implementations are meant to be illustrative and non-limiting, and show examples of circuits that may be used to achieve a detection operation. Thus, other circuits may be used to detect that the electronic device 300 has been installed, activated, or in use.

In the implementation in FIG. 3C, when the electronic device 300 is not brought in close proximity to or in contact with an object 130, a signal associated with the first sensor 340 may have a given time constant (e.g., RC time constant) based on values of the capacitance C and the resistance R. Such a signal may be generated by stimulating the circuit with a given pulse or signal from either a voltage source or a current source. Such a signal may be applied to node 344a of a resistor 344. A response may be "read" from node 344b, which may be coupled to a pin on the controller 330. For example, a rise time 349 of such a pulse or signal may be measured by the controller 330 by reading the signal on node 344b. Alternatively, the signal may be generated internally in the controller 330 based on the time constant established by values of the capacitance C and the resistance R. Persons skilled in the art will appreciate that other approaches may also be used to take advantage of that relationship established by the values of the capacitance C and the resistance R.

When the electronic device 300 is in close proximity to an object to be detected, the effective capacitance C of the capacitive sensor 340 changes to C'. For example, this can be due in part to the difference in dielectric properties between air and skin/tissue. In response to the change in capacitance from C to C', the signal associated with the capacitive sensor 340 may have a new time constant (e.g., RC' time constant) based on the new value of the capacitance C' and the resistance R. Such a signal may be generated by energizing or stimulating the capacitive sensor 340 to charge the capacitor 342. Thus, the signal may be generated by stimulating the circuit with a given pulse or signal applied to node 344a and reading the response from node 344b. For example, a rise time 349 of such a pulse or signal may be measured and received by the controller 330. The difference in rise times 349 in detected and non-detected states may be measured and received by the controller 330, where the difference in rise times 349 may be indicative of the rate of capacitance charge. As a result, a specified condition of the electronic device 300 may be determined based on the difference in rise times 349. While times are described as rise times, decay times may also be effectively used to calculate the differences in the time constants between detected and non-detected states.

Detected and non-detected states of the electronic device 300 may be determined by comparing readings of the rate of capacitance charge with either previous readings or stored readings that are known to correspond to non-detected states. Depending on the values selected for R and C, for example, the difference between detected and non-detected states may vary greatly. However, some selections for values of R and C may lead to high sensitivity for the electronic device 300. A capacitive sensor 340 with a high sensitivity may be more prone to providing false positive determinations. Values for R and C, in some implementations may further depend on a time used to measure the RC time constant (e.g., rise time, decay time). A further consideration for the values of R and C in some implementations can include the current consumption. Current consumption may depend directly on the applied voltage levels, measurement time, and/or other considerations. In some implementations, in order to provide extended battery life, current consumption may be minimized while preserving detection sensitivity. As noted above, instead of including a resistor 344, similar results may be obtained using a current source to energize the capacitive sensor 340.

The capacitive sensor 340 includes one or more active nodes 346, where each active node 346 has a conductive surface. In FIG. 3C, the capacitive sensor 340 includes at least one active node 346. The active node 346 may be encased or enclosed with other components of the electronic device 300 in a housing 310. The capacitive sensor 340 may include one or more ground nodes 348, where each ground node 348 has a conductive surface. In FIG. 3C, the capacitive sensor 340 includes at least one ground node 348. The ground node 348 may be positioned anywhere within the electronic device 300 or on the electronic device 300. For example, the ground node 348 can be a floating electrode within the housing 310.

Because the electronic device 300 may be placed in close proximity to or in contact with an object, exposure to a variety of elements hostile to electronics is possible, such as moisture, water, other fluids or materials, or shock from mechanical contact with devices. Therefore, encapsulation may refer to encasing components of the electronic device 300 in a material, such as a resin or other material, that provides a barrier or seal protecting circuitry from environmental elements. Encapsulation may further provide structural support for delicate components, such as for the purpose of holding the components in a particular placement or orientation, and for protecting the components from damage. In some implementations, the conductive surfaces 346, 348 may have an effective capacitance between them in detected and non-detected states. When the electronic device 300 comes in close proximity to or in contact with an object to be detected, the electric fields associated with the conductive surfaces 346, 348 may be modified, which directly changes the effective capacitance from C to C'. At least one of the conductive surfaces 346, 348 may be enclosed by the housing 310 and not in direct contact with the object to be detected. Thus, potential degradation of at least one of the conductive surfaces 346, 348 may be reduced. Enclosure by the housing 310 may further limit the influence of environmental factors, such as moisture, on readings provided by the capacitive sensor 340. Further, the material of the housing 310 that encloses capacitive sensor 340 may be configured to reduce the potential for irritation of the skin. Thus, by limiting direct contact with the conductive surfaces 346, 348, the conductive surfaces 346, 348 may be protected as well as the skin of the body. The difference in the rate of capacitance charge may be detected by comparing rise times 349 of a signal that is affected by the change in the RC time constant, from an RC time constant to an RC' time constant.

Figure 3D:
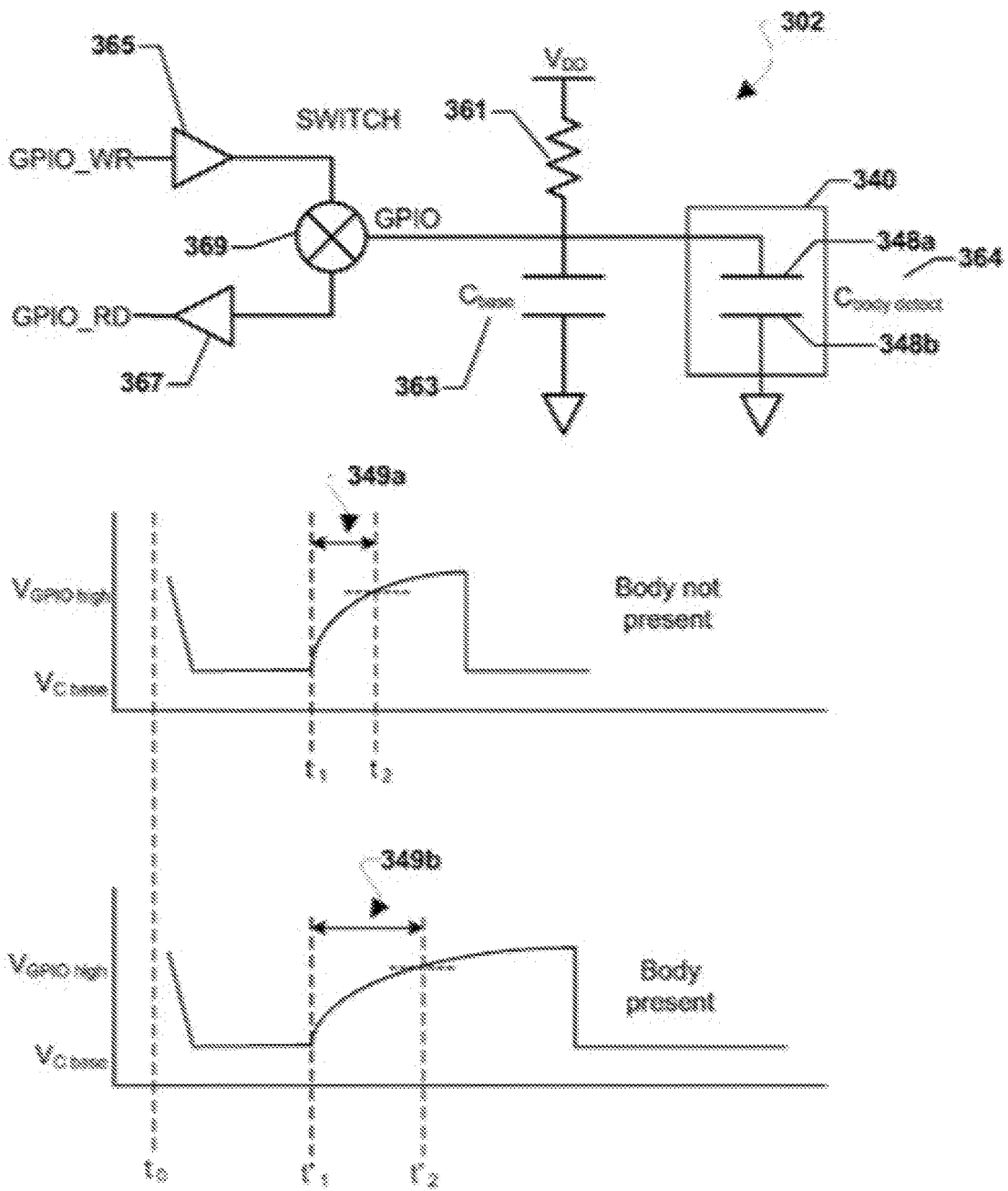
FIG. 3D is a circuit and timing diagram illustrating operation of a capacitive sensor of an example electronic device according to some implementations.

FIG. 3D is a circuit and timing diagram illustrating operation of a capacitance sensor of an example electronic device according to some implementations. In some implementations as shown in implementation 302, a signal may be output or "written" to the capacitive sensor 340 or read from the capacitive sensor 340 from a general purpose input/output (GPIO) pin of the controller 330. The output signal may charge an RC circuit of the capacitive sensor 340, which may be composed of a resistance 361, a base capacitance $C_{base}$ 363, and a body detection capacitance $C_{body\_detect}$ 364. The body detection capacitance $C_{body\_detect}$ 364 may be composed of electrodes 348a, 348b, which in some implementations can include a pair of conductive surfaces or electrodes. The GPIO pin of the controller 330 may be an input and output pin. The GPIO pin of the controller 330 may be coupled to a switch 369 that switches the GPIO pin between input and output functions.

In an output mode, the switch 369 may be coupled to a pin driver 365. When an output signal GPIO_WR is generated by the controller 330, the output signal may be coupled through the pin driver 365 and the switch 369 to the capacitive sensor 340.

In an input mode, the switch 369 may be coupled to a pin buffer 367 such that an input from the capacitive sensor 340 may be read through the switch 369. Switching the state of the switch 369 may be controlled by the controller 330. For example, the controller 330 may configure the switch 369 in the output mode. The controller 330 may generate the output signal GPIO_WR and apply the signal to the capacitive sensor 340 through the pin driver 365 and the switch 369. The output signal may be applied to the capacitive sensor 340 to energize the capacitive sensor 340 and charge the capacitive sensor 340 at the beginning of a monitoring cycle. The controller 330 may then change the switch 369 to an input mode, where the input signal GPIO_RD may be read through the pin buffer 367, the switch 369, and the capacitive sensor 340. For example, the input signal GPIO_RD may enable the controller 330 to read a charge profile or time constant of the capacitive sensor 340. It is understood that other configurations to apply and read signals from the capacitive sensor 340 are possible.

In some implementations, for example when an object to be detected is not present, the controller 330 may switch the operation of the general purpose signal line by applying an output signal GPIO_WR at a time to. The controller 330 may then switch to an input mode to receive an input signal GPIO_RD from the capacitive sensor 340. The rise characteristic of the signal may be read during a charge phase or the decay characteristic of the signal may be read after the charge phase. In some implementations, at a time $t_1$ a charge period for the combined capacitances of the capacitance $C_{base}$ 363 and the body detection capacitance $C_{body\_detect}$ 364 may begin. The signal may continue to charge until a threshold value is reached, such as at time $t_2$ when a voltage $V_{GPIO\_high}$ is reached. Thus, when the charge/discharge level reaches the threshold value, time $t_2$ may be read and a time 349a between $t_1$ and $t_2$ may be measured.

In some implementations, for example, when an object to be detected is present, the controller 330 may switch the operation of the general purpose signal line by applying an output signal GPIO_WR at a time to. The controller 330 may then switch to an input mode to receive an input signal GPIO_RD from the capacitive sensor 340. Alternatively, a voltage source may be applied to the node 346b as described above, and the controller 330 may manipulate the voltage level on the node 346b by selectively toggling a pin coupled to the resistor 346 to achieve an input signal. The rise or decay characteristic of the signal may be read during a charge or discharge phase, respectively, such as on the node 346b as described herein above. In some implementations when an object to be detected is present, at a time $t'_1$ a charge/discharge period for the combined capacitances of the capacitance $C_{base}$ 363 and the body detection capacitance $C_{body\_detect}$ 364 may begin. The presence of the object may change the capacitance of the body detection capacitance $C_{body\_detect}$ 364, having the effect of changing the combined capacitance. The signal may continue to charge or discharge until a threshold value is reached, such as at a time $t'_2$ when a voltage $V_{GPIO\_high}$ is reached. When the charge or discharge level reaches the threshold value, time $t'_2$ may be read and a time 349b between $t'_1$ and $t'_2$ may be measured. In some implementations, the thresholds may be modified to adjust the sensitivity of detecting when an object is present or not.

The difference in the time measurements, such as the difference between the time 349a (e.g., $t_1$ to $t_2$) and the time 349b (e.g., $t'_1$ to $t'_2$), can reflect the different capacitances between an object present and an object not present condition. This difference may thus be used to detect the presence of the object. This difference may be indicative of a rate of capacitance charge of the capacitive sensor 340. Alternatively, the difference between time measurements $t_1$ and $t_2$ and $t'_1$ and $t'_2$ may be used to measure an effective capacitance associated with an object being present or not present. This difference may also be indicative of a rate of capacitance charge of the capacitive sensor 340. Thus, a longer charge cycle for charging the capacitive sensor 340 is generally indicative of the presence of an object, such as a person's body. As the capacitance increases due to proximity to an object, the time taken for the capacitive sensor 340 to charge will increase. The presence of the object may indicate that the electronic device 300 is in close proximity to or in contact with the object.

In some implementations, two or more GPIO lines may be used. One GPIO line may be used for applying a signal to charge a capacitance sensor of the capacitive sensor 340, thereby providing a capacitance between electrodes 348a, 348b. The other GPIO line may be used to measure or read the voltage from the capacitance, such as through a direct connection to one or more of the electrodes 348a, 348b.

Advancements in technology have led to the miniaturization of many products and devices. More and more products and devices are being implemented in smaller sizes, operated at reduced power, and manufactured at lower costs. The products and devices may be encased or enclosed in a housing to provide more protection from the environment or external forces.

Components of such products and devices may be designed to meet various device constraints. Some of the device constraints can include size, shape, power consumption, cost, material, intended use, and intended lifetime. Some of the device constraints can be related to design preferences, user preferences, customer preferences, and marketing preferences.

In some implementations, a size constraint or preference can limit an electronic device to small geometries. For example, the electronic device may have a small size in order to reduce burden to the user. The electronic device may include a capacitive sensor configured to detect contact or close proximity to an object to be detected. Accordingly, a size constraint or preference can limit the capacitive sensor to small geometries. However, smaller geometries can result in smaller sensor areas in a capacitive sensor, which results in reduced capacitance so that the range of capacitance change is smaller. This means that a sensitivity of the capacitive sensor is reduced and the range over which an object can be detected is reduced.

In some implementations, certain device constraints or preferences may limit the sensitivity of the capacitive sensor. The electronic device may include a power supply that is small in size, such as a coin cell battery. A small-sized power supply may be limited to provide power for low-power operations. The electronic device may further include a processor for performing one or more operations of the electronic device. In some implementations, a cost or power constraint can limit the electronic device to a processor that is small in size, that is low in cost, and that does not run at a very high speed (e.g., frequency), since higher speeds can consume more power. A clock rate of a processor is related to how short of a duration can be measured in a capacitive sensor. A higher clock rate can detect changes in capacitance over fewer microseconds, thereby increasing a sensing resolution of the capacitive sensor. However, sensitivity of the capacitive sensor may be limited when an electronic device is limited to a small-sized capacitive sensor and a low-speed processor.

A housing that encloses the capacitive sensor may further reduce the sensitivity of the capacitive sensor. The housing may be provided to meet certain device constraints or preferences. In some implementations, the housing is made of an electrically insulating material, such as a plastic. The housing may increase separation between a sensor electrode of the capacitive sensor and an object to be detected, where a separation distance can be at least a thickness of the housing. Thus, introduction of the housing in the electronic device can make it harder to detect changes in capacitance for the capacitive sensor.

Various implementations of the present disclosure relate to an electronic device including a capacitive sensor and a controller coupled to the capacitive sensor, where the controller is configured to determine whether the electronic device is in contact or in close proximity to an object. The capacitive sensor can include a capacitor having at least one sensor electrode. The determination can be based at least in part on a rate of capacitance charge of the capacitor when the capacitive sensor is energized. For example, when an object approaches the capacitive sensor, a time constant increases. Thus, how long it takes to charge the capacitor of the capacitive sensor is indicative of whether an electronic device is in contact or in close proximity to the object. The electronic device further includes a housing that encloses the capacitive sensor and separates the sensor electrode from an outer surface of the housing by the housing. At least a first portion or a bulk of the housing includes an electrically insulating material, such as a plastic. As described below, at least a second portion of the housing includes a partially conductive material, or an electrically conductive element is provided on an inner surface of the housing or at least partially embedded in the housing. This effectively extends the sensor electrode closer to the outer surface of the housing and/or effectively increases a surface area of the sensor electrode.

Figure 4:
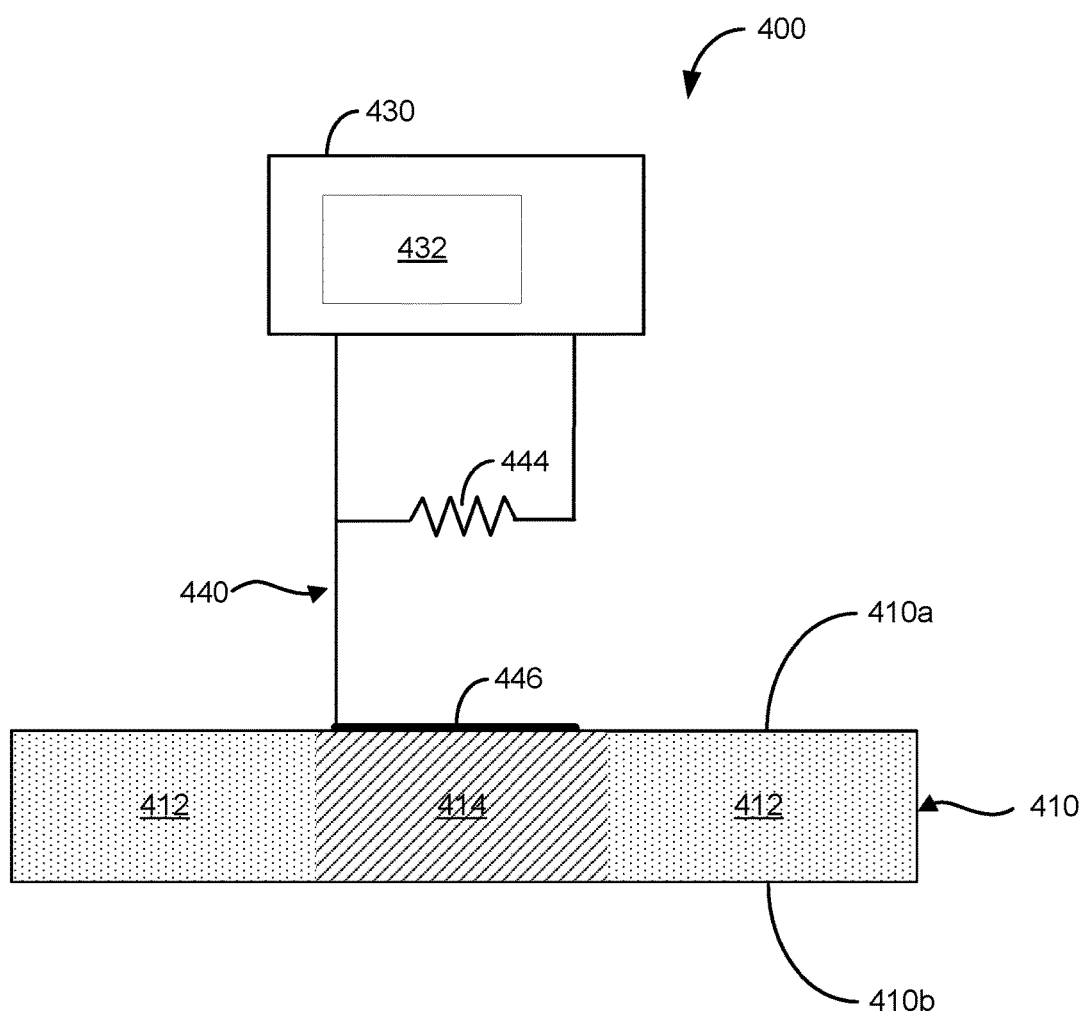
FIG. 4 is a block diagram representation of an example capacitive sensor of an electronic device with a housing having a portion that is at least partially conductive according to some implementations.

FIG. 4 is a block diagram representation of an example capacitive sensor of an electronic device with a housing having a portion that is at least partially conductive according to some implementations. An electronic device 400 includes a controller 430, a capacitive sensor 440 coupled to the controller 430, and a housing 410 that encloses the capacitive sensor 440 and the controller 430. In some implementations, aspects of the electronic device 400 of FIG. 4 include some or all of the aspects of the electronic device 100 of FIG. 1 or the electronic device 300 of FIGS. 3A-3D. The capacitive sensor 440 includes a sensor electrode 446 that serves as an active node having an electrically conductive surface. In some implementations, a sensor electrode, such as the sensor electrode 446, can also be referred to as a conductive pad, conductive plate, sensor pad, sensor plate, or positive plate. The sensor electrode 446 may be part of a capacitor of the capacitive sensor 440 that is capable of being charged to a capacitance. In some implementations, the capacitor includes a ground node or ground electrode.

A surface area of the sensor electrode 446 of the capacitive sensor 440 may be relatively small. In some implementations, the size of the sensor electrode 446 may be influenced by design constraints or preferences of the electronic device that the capacitive sensor 440 is a part of. As used herein and throughout this disclosure, a "small" surface area for a sensor electrode 446 includes a surface area that is less than about 625 square millimeters. For example, the surface area of the sensor electrode 446 is less than about 400 square millimeters, less than about 225 square millimeters, between about nine square millimeters and about 225 square millimeters, between about fifty square millimeters and about 100 square millimeters, or between about twenty square millimeters and about fifty square millimeters. The small surface area of the sensor electrode 446 may limit the sensing resolution of the capacitive sensor 440, as a capacitance of a capacitor is directly proportional to a surface area of the electrodes of the capacitor. However, it will be understood that the electronic device 400 of the present disclosure is not limited to a sensor electrode 446 with a small surface area, but the electronic device 400 can include a sensor electrode 446 with a large surface area, including a surface area equal to or greater than about 625 square millimeters.

In some implementations, the capacitive sensor 440 further includes a resistor 444 coupled to the sensor electrode 446. For example, the resistor 444 can be electrically connected in series with the sensor electrode 446. A controller 430 is coupled to the capacitor and the resistor 444, where the controller 430 can apply a pulse or signal to the resistor 444 having a resistance R to charge the capacitor to an effective capacitance C. A given time constant, such as an RC time constant, can be measured. The time constant can be indicative of the rate of capacitance charge of the capacitor. In some implementations, the controller 430 can determine whether the electronic device 400 is in contact or in close proximity to an object based at least in part on the rate of capacitance charge of the capacitor when the capacitive sensor 440 is energized. In some other implementations, however, the capacitive sensor 440 can include hardware components to determine whether the electronic device 400 is in contact or in close proximity to an object based at least in part on the rate of capacitance charge of the capacitor when the capacitive sensor 440 is energized. The controller 430 can include at least a general purpose single- or multi-chip processor, a digital signal processor (DSP), an application specific integrated circuit (ASIC), a field programmable gate array (FPGA) or other programmable logic device, discrete gate or transistor logic, or discrete hardware components.

In some implementations, the controller 430 includes a processor 432. The processor 432 of the controller 430 can have a clock rate that is high enough for the time it takes to charge the capacitor 442. In some implementations, the processor 432 of the controller 430 can run between a few Megahertz to tens or hundreds of Megahertz. For example, the processor 432 of the controller 430 can have a clock rate that is equal to or greater than about two Megahertz, equal to or greater than about four Megahertz, equal to or greater than about eight Megahertz, equal to or greater than about sixteen Megahertz, or equal to or greater than about thirty two Megahertz. The clock rate of the processor 432 may be limited by power constraints of the electronic device. In some implementations, the clock rate of the processor 432 is less than about 600 Megahertz, less than about 100 Megahertz, or less than about fifty Megahertz.

In FIG. 4, a housing 410 separates the sensor electrode 446 by a separation distance. The housing 410 has an inner surface 410*a* facing the capacitive sensor 440 and an outer surface 410*b* opposite the inner surface 410*a* and facing an outside environment. In some implementations, the housing 410 separates the sensor electrode 446 from the outer surface 410*b* by at least a thickness of the housing 410. It will be understood that a thickness of the housing 410 can be non-uniform, and so the thickness of the housing 410 can refer to a thickness corresponding to a portion of the housing 610 directly between the sensor electrode 446 and the outer surface 410*b*. In some implementations, the inner surface 410*a* of the housing 410 encloses the capacitive sensor 440. At least a first portion 412 of the housing 410 includes an electrically insulating material, such as a non-conductive plastic. In some implementations, an electrically insulating material has an electrical resistivity equal to or greater than about $1 \times 10^5$ Ω-m, equal to or greater than about $1 \times 10^6$ Ω-m, equal to or greater than about $1 \times 10^7$ Ω-m, equal to or greater than about $1 \times 10^8$ Ω-m, equal to or greater than about $1 \times 10^9$ Ω-m, or equal to or greater than about $1 \times 10^{10}$ Ω-m at twenty degrees Celsius. For example, typical acrylonitrile butadiene styrene (ABS) plastic has an electrical resistivity between $1 \times 10^{10}$ Ω-m and $1 \times 10^{15}$ Ω-m at twenty degrees Celsius. In some implementations, the resistance measured in the electrically insulating material is equal to or greater than about $1 \times 10^6$ Ω, equal to or greater than about $1 \times 10^7$ Ω, equal to or greater than about $1 \times 10^8$ Ω, equal to or greater than about $1 \times 10^9$ Ω, equal to or greater than about $1 \times 10^{10}$ Ω, or equal to or greater than about $1 \times 10^{11}$ Ω. This can be calculated for a housing 410 having a thickness of one millimeter across a surface area of 100 square millimeters. For example, if the electrically insulating material, such as ABS plastic, has an electrical resistivity of $1 \times 10^{10}$ Ω-m, then the resistance of the housing 410 can be calculated to be $1 \times 10^{11}$ Ω.

At least a second portion 414 of the housing 410 includes a partially conductive material. In some implementations, a partially conductive material has an electrical resistivity equal to or less than about $5 \times 10^5$ Ω-m, equal to or less than about $1 \times 10^5$ Ω-m, equal to or less than about $1 \times 10^4$ Ω-m, equal to or less than about $1 \times 10^3$ Ω-m, or equal to or less than about $1 \times 10^2$ Ω-m. For example, the partially conductive material has an electrical resistivity between about $1 \times 10^{-1}$ Ω-m and about $5 \times 10^5$ Ω-m, between about 1 Ω-m and about $1 \times 10^5$ Ω-m, between about 1 Ω-m and about $1 \times 10^4$ Ω-m, between about 1 Ω-m and about $1 \times 10^3$ Ω-m, or between about 10 Ω-m and about $1 \times 10^2$ Ω-m. The electrical resistivity of the partially conductive material can depend on the electrical resistance generated by the resistor 444, the thickness of the housing 410, and the surface area of the second portion 414 of the housing 410. The electrical resistance of the resistor 444 may determine an upper limit of the resistance of the partially conductive material. For example, where the electrical resistance generated by the resistor 444 is $1 \times 10^6$ Ω, an upper limit of the resistance of the partially conductive material can be $1 \times 10^5$ Ω. If the thickness of the housing 410 is one millimeter and the surface area of the second portion 414 of the housing 410 is 100 square millimeters, then an upper limit of the electrical resistivity of the partially conductive material can be $1 \times 10^4$ Ω-m. In some implementations, the resistance measured in the partially conductive material is equal to or less than about $5.0 \times 10^6$ Ω, equal to or less than about $1.0 \times 10^6$ Ω, equal to or less than about $1.0 \times 10^5$ Ω, equal to or less than about $1.0 \times 10^4$ Ω, or equal to or less than about $1.0 \times 10^3$ Ω.

An electrical resistance of the resistor 444 is greater than an electrical resistance measured in the partially conductive material. In some implementations, the electrical resistance of the resistor 444 is at least five times greater than an electrical resistance of the partially conductive material. In some implementations, the electrical resistance of the resistor 444 can be equal to or greater than about $2 \times 10^5$ Ω, equal to or greater than about $5 \times 10^5$ Ω, or equal to or greater than about $1 \times 10^6$ Ω. However, it will be understood that the electrical resistance of the resistor 444 may be smaller where a sensor electrode area is larger. Comparatively, the electrical resistance of the partially conductive material is equal to or less than about $1 \times 10^5$ Ω, equal to or less than about $1 \times 10^4$ Ω, or equal to or less than about $1 \times 10^3$ Ω. The electrical resistance of the partially conductive material is not so high that it interferes with measurements of a rate of capacitance charge, including time constant measurements. Thus, the impact of the electrical resistance of the partially conductive material is negligible during operation of the capacitive sensor 440.

In some implementations, the partially conductive material of the second portion 414 includes the electrically insulating material of the first portion 412 but is carbon-filled or carbon-impregnated. Carbon-filled or carbon-impregnated materials are composite materials including a matrix and a filler material, where the matrix can be the electrically insulating material. In some implementations, the partially conductive material can be between ten percent and about forty percent by weight. In some implementations, the partially conductive material can be greater than about eight percent by weight or greater than about twenty five percent by weight. For example, the partially conductive material can include a plastic that is carbon-filled or carbon-impregnated. Examples of carbon-filled or carbon-impregnated plastic can include but is not limited to carbon-filled polyurethane, carbo-filled polyethylene, carbon-filled polyamide, carbon-filled acrylonitrile-butadiene-styrene (ABS) copolymer, and carbon-filled polypropylene. In forming a carbon-filled thermoplastic, for example, carbon particles can be mixed together in a thermoplastic material and then set or formed at an appropriate temperature and pressure. It will be understood that the electrically insulating material can be filled with other material other than carbon to make the second portion 414 at least partially conductive. However, the partially conductive material can be free or substantially free of metals, where "substantially free of metals" refers to less than about 0.5% by volume of metals in the partially conductive material.

The sensor electrode 446 is separated from the outer surface 410b of the housing 410 by a separation distance, where the separation distance can include at least a thickness of the housing 410 at the second portion 414 of the housing 410. Design constraints or preferences may influence the separation distance of the sensor electrode 446 from the outer surface 410b of the housing 410. In some implementations, the separation distance is between about 0.5 millimeters and about five millimeters, between about 0.75 millimeters and about four millimeters, or between about one millimeter and about three millimeters.

The sensor electrode 446 may be disposed on the inner surface 410a of the housing 410 and in conductive contact with the second portion 414 of the housing 410. The second portion 414 of the housing 410 is not in conductive contact with a ground electrode of the capacitive sensor 440. An entirety or a fraction of the sensor electrode 446 may be in conductive contact with the second portion 414 of the housing 410. The second portion 414 of the housing 410 can extend from the inner surface 410a to the outer surface 410b of the housing 410. This effectively extends the sensor electrode 446 to the outer surface 410b to increase the sensitivity and range over which an object can be detected by the capacitive sensor 440.

As discussed above, the sensitivity and range over which an object can be detected by the capacitive sensor 440 can be limited by the sensor electrode 446 having a relatively small surface area, the processor 432 of the controller 430 having a relatively low clock rate, and a thickness of the housing 410 resulting in a relatively large separation distance between the sensor electrode 446 and the outer surface 410b of the housing 410. However, the sensor electrode 446 being in conductive contact with a partially conductive material of the second portion 414 of the housing 410 increases the sensitivity and range over which an object can be detected by effectively extending the sensor electrode 446 to the outer surface 410b of the housing 410.

Figure 5:
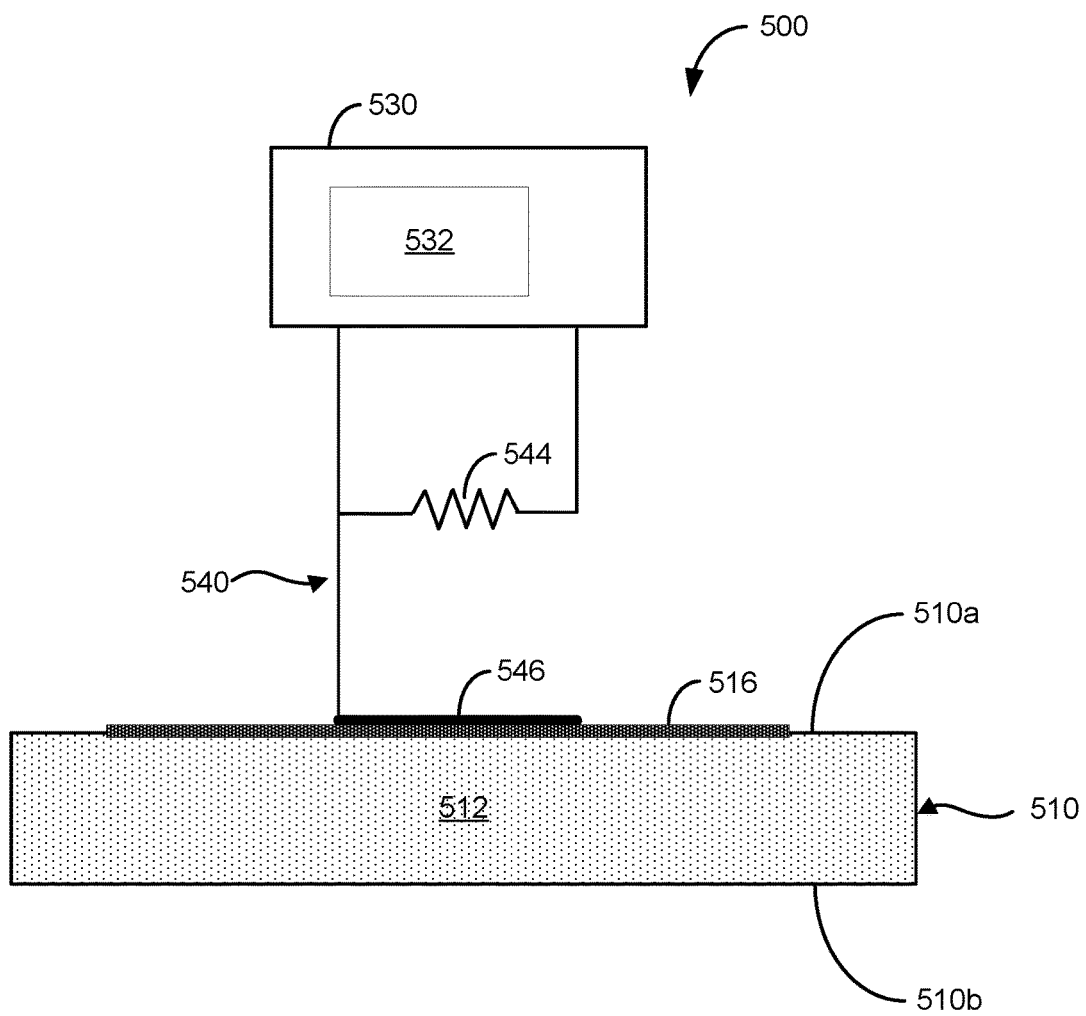
FIG. 5 is a block diagram representation of an example capacitive sensor of an electronic device with a housing and an electrically conductive element on an inner surface of the housing according to some implementations.

FIG. 5 is a block diagram representation of an example capacitive sensor of an electronic device with a housing and an electrically conductive element on an inner surface of the housing according to some implementations. An electronic device 500 includes a controller 530, a capacitive sensor 540 coupled to the controller 530, and a housing 510 that encloses the capacitive sensor 540 and the controller 530. In some implementations, aspects of the electronic device 500 of FIG. 5 include some or all of the aspects of the electronic device 100 of FIG. 1 and/or the electronic device 300 of FIGS. 3A-3D. The capacitive sensor 540 includes a sensor electrode 546 that serves as an active node having an electrically conductive surface. The sensor electrode 546 may be part of a capacitor of the capacitive sensor 540 that is capable of being charged to a capacitance. In some implementations, the capacitor includes a ground node or ground electrode.

A surface area of the sensor electrode 546 of the capacitive sensor 540 may be relatively small. In some implementations, the surface area of the sensor electrode 546 is less than about 625 square millimeters, less than about 400 square millimeters, less than about 225 square millimeters, between about nine square millimeters and about 225 square millimeters, between about fifty square millimeters and about 100 square millimeters, or between about twenty square millimeters and about fifty square millimeters. However, it will be understood that the electronic device 500 of the present disclosure is not limited to a sensor electrode 546 with a small surface area, but the electronic device 500 can include a sensor electrode 546 with a large surface area, including a surface area equal to or greater than about 625 square millimeters.

In some implementations, the capacitive sensor 540 includes a resistor 544 coupled to the sensor electrode 546. For example, the resistor 544 can be electrically connected in series with the sensor electrode 546. A controller 530 is coupled to the capacitor and the resistor 544, where the controller 530 can apply can apply a pulse or signal to the resistor 544 having a resistance R to charge the capacitor to an effective capacitance C. Aspects of the resistor 544 in FIG. 5 can be identical or similar to aspects of the resistor 444 in FIG. 4, and aspects of the controller 530 can be identical or similar to aspects of the controller 430 in FIG. 4. For example, an electrical resistance of the resistor 544 can be equal to or greater than about $2\times10^5\Omega$, equal to or greater than about $5\times10^5\Omega$, equal to or greater than about $1\times10^6\Omega$, or between about $5\times10^5\Omega$ and about $1\times10^7\Omega$. However, it will be understood that the electrical resistance of the resistor 544 may be smaller where the sensor electrode area is larger. In addition, a clock rate of a processor 532 of the controller 530 can be less than about 600 Megahertz, less than about 100 Megahertz, or less than about fifty Megahertz. For example, the clock rate of the processor 532 can be about sixteen Megahertz or about thirty two Megahertz. In some implementations, the controller 530 can determine whether the electronic device 500 is in contact or in close proximity to an object based at least in part on a rate of capacitance charge of the capacitor when the capacitive sensor 540 is energized. In some other implementations, however, the capacitive sensor 540 can include hardware components to determine whether the electronic device 500 is in contact or in close proximity to an object based at least in part on the rate of capacitance charge of the capacitor when the capacitive sensor 540 is energized.

In FIG. 5, a housing 510 separates the sensor electrode 546 by a separation distance. The housing 510 has an inner surface 510a facing the capacitive sensor 540 and an outer surface 510b opposite the inner surface 510a and facing an outside environment. In some implementations, the housing 510 separates the sensor electrode 546 from the outer surface 510b by at least a thickness of the housing 510. In some implementations, the inner surface 510a of the housing 510 encloses the capacitive sensor 540. The housing 510 includes an electrically insulating material, such as a non-conductive plastic. In some implementations, the housing 510 consists of or consists essentially of the electrically insulating material. In some implementations, an electrically insulating material has an electrical resistivity equal to or greater than about $1\times10^5$ $\Omega$-m, equal to or greater than about $1\times10^6$ $\Omega$-m, equal to or greater than about $1\times10^7$ $\Omega$-m, equal to or greater than about $1\times10^8$ $\Omega$-m, equal to or greater than about $1\times10^9$ $\Omega$-m, or equal to or greater than about $1\times10^{10}$ $\Omega$-m at twenty degrees Celsius. In some implementations, the resistance measured in the electrically insulating material is equal to or greater than about $1\times10^6\Omega$, equal to or greater than about $1\times10^7\Omega$, equal to or greater than about $1\times10^8\Omega$, equal to or greater than about $1\times10^9\Omega$, equal to or greater than about $1\times10^{10}\Omega$, or equal to or greater than about $1\times10^{11}\Omega$. This can be calculated for a housing 510 having a thickness of one millimeter across a surface area of 100 square millimeters.

An electrically conductive element 516 can be disposed on the inner surface 510a of the housing 510. In some implementations, the electrically conductive element 516 can include a metalized coating or other electrically conductive coating, such as electrically conductive paint. A metalized coating or other electrically conductive coating can include materials such as graphite, silver, copper, gold, aluminium, titanium, tungsten, nickel, zinc, platinum, iron, manganese, or combinations thereof. In some implementations, a material of the electrically conductive element 516 has an electrical resistivity equal to or less than about $1\times10^{-3}$ Ω-m, equal to or less than about $1\times10^{-4}$ Ω-m, equal to or less than about $1\times10^{-5}$ Ω-m, equal to or less than about $1\times10^{-6}$ Ω-m, or equal to or less than about $1\times10^{-7}$ Ω-m at twenty degrees Celsius.

The sensor electrode 546 is separated from the outer surface 510b of the housing 510 by a separation distance, where the separation distance can include at least a thickness of the housing 510. It will be understood that a thickness of the housing 510 may be non-uniform, and so the thickness of the housing 510 can refer to a minimum thickness of the housing 510 or a thickness corresponding to a portion of the housing 510 directly between the sensor electrode 546 and the outer surface 510b. Design constraints or preferences may influence the separation distance of the sensor electrode 546 from the outer surface 510b of the housing 510. In some implementations, the separation distance is between about 0.5 millimeters and about five millimeters, between about 0.75 millimeters and about four millimeters, or between about one millimeter and about three millimeters.

The sensor electrode 546 may be disposed on the electrically conductive element 516 in conductive contact with the electrically conductive element 516. An entirety or a fraction of the sensor electrode 546 may be in conductive contact with the electrically conductive element 516. A surface area of the electrically conductive element 516 is larger than a surface area of the sensor electrode 546. In some implementations, the surface area of the electrically conductive element 516 is at least five times greater than the surface area of the sensor electrode 546. This effectively increases the surface area or the size of the sensor electrode 546 to increase the sensitivity and range over which an object can be detected by the capacitive sensor 540.

The sensitivity and range over which an object can be detected by the capacitive sensor 540 can be limited by the sensor electrode 546 having a relatively small surface area, the processor 532 of the controller 530 having a relatively low clock rate, and a thickness of the housing 510 resulting in a relatively large separation distance between the sensor electrode 546 and the outer surface 510b of the housing 510. However, the sensor electrode 546 being in conductive contact with the electrically conductive element 516 disposed on the inner surface 510a of the housing 510 increases the sensitivity and range over which an object can be detected by effectively increasing the size of the sensor electrode 546.

Figure 6:
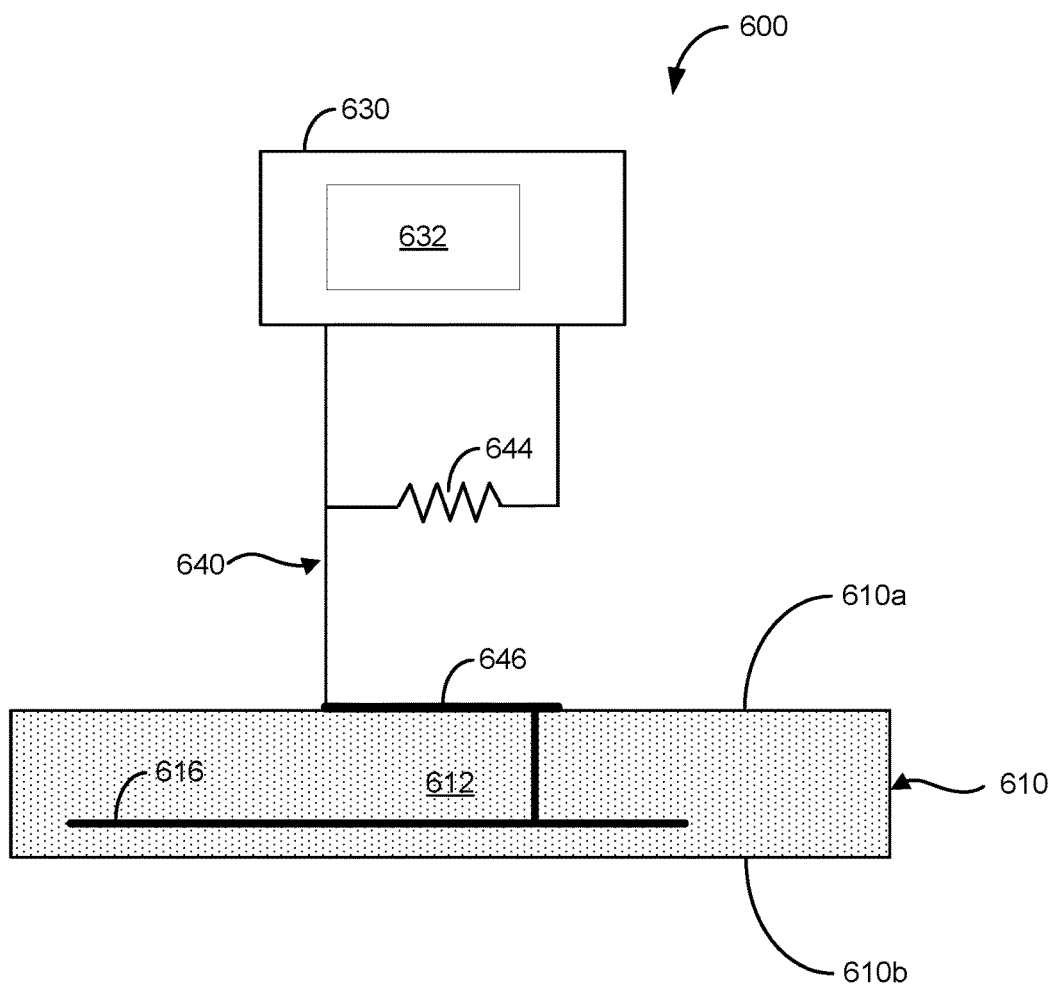
FIG. 6 is a block diagram representation of an example capacitive sensor of an electronic device with a housing and an electrically conductive element embedded in the housing according to some implementations.

FIG. 6 is a block diagram representation of an example capacitive sensor of an electronic device with a housing and an electrically conductive element at least partially embedded in the housing according to some implementations. An electronic device 600 includes a controller 630, a capacitive sensor 640 coupled to the controller 630, and a housing 610 that encloses the capacitive sensor 640 and the controller 630. In some implementations, aspects of the electronic device 600 of FIG. 6 include some or all of the aspects of the electronic device 100 of FIG. 1 and the electronic device 300 of FIGS. 3A-3D. The capacitive sensor 640 includes a sensor electrode 646 that serves as an active node having an electrically conductive surface. The sensor electrode 646 may be part of a capacitor of the capacitive sensor 640 that is capable of being charged to a capacitance. In some implementations, the capacitor includes a ground node or ground electrode.

A surface area of the sensor electrode 646 of the capacitive sensor 640 may be relatively small. In some implementations, the surface area of the sensor electrode 646 is less than about 625 square millimeters, less than about 400 square millimeters, less than about 225 square millimeters, between about nine square millimeters and about 225 square millimeters, between about fifty square millimeters and about 100 square millimeters, or between about twenty square millimeters and about fifty square millimeters. However, it will be understood that the electronic device 600 of the present disclosure is not limited to a sensor electrode 646 with a small surface area, but the electronic device 600 can include a sensor electrode 646 with a large surface area, including a surface area equal to or greater than about 625 square millimeters.

In some implementations, the capacitive sensor 640 includes a resistor 644 coupled to the sensor electrode 646. For example, the resistor 644 can be electrically connected in series with the sensor electrode 646. A controller 630 is coupled to the capacitor and the resistor 644, where the controller 630 can apply can apply a pulse or signal to the resistor 644 having a resistance R to charge the capacitor to an effective capacitance C. Aspects of the resistor 644 in FIG. 6 can be identical or similar to aspects of the resistor 444 in FIG. 4 and the resistor 544 in FIG. 5, and aspects of the controller 630 can be identical or similar to aspects of the controller 430 in FIG. 4 and the controller 530 of FIG. 5. For example, an electrical resistance of the resistor 644 can be equal to or greater than about $2\times10^5$Ω, equal to or greater than about $5\times10^5$Ω, equal to or greater than about $1\times10^6$Ω, or between about $5\times10^5$Ω and about $1\times10^7$Ω. In addition, a clock rate of a processor 632 of the controller 630 can be less than about 600 Megahertz, less than about 100 Megahertz, or less than about fifty Megahertz. For example, the clock rate of the processor 632 can be about sixteen Megahertz or about thirty two Megahertz. In some implementations, the controller 630 can determine whether the electronic device 600 is in contact or in close proximity to an object based at least in part on a rate of capacitance charge of the capacitor when the capacitive sensor 640 is energized. In some other implementations, however, the capacitive sensor 640 can include hardware components to determine whether the electronic device 600 is in contact or in close proximity to an object based at least in part on the rate of capacitance charge of the capacitor when the capacitive sensor 640 is energized.

In FIG. 6, a housing 610 separates the sensor electrode 646 by a separation distance. The housing 610 has an inner surface 610a facing the capacitive sensor 640 and an outer surface 610b opposite the inner surface 610a and facing an outside environment. In some implementations, the housing 610 separates the sensor electrode 646 by at least a thickness of the housing 610. In some implementations, the inner surface 610a of the housing 610 encloses the capacitive sensor 640. The housing 610 includes an electrically insulating material, such as a non-conductive plastic. In some implementations, the housing 610 consists of or consists essentially of the electrically insulating material. In some implementations, an electrically insulating material has an electrical resistivity equal to or greater than about $1\times10^5$ Ω-m, equal to or greater than about $1\times10^6$ Ω-m, equal to or greater than about $1\times10^7$ Ω-m, equal to or greater than about $1\times10^8$ Ω-m, equal to or greater than about $1\times10^9$ Ω-m, or equal to or greater than about $1\times10^{10}$ Ω-m at twenty degrees Celsius. In some implementations, the resistance measured in the electrically insulating material is equal to or greater than about $1\times10^6 \Omega$, equal to or greater than about $1\times10^7 \Omega$, equal to or greater than about $1\times10^8 \Omega$, equal to or greater than about $1\times10^9 \Omega$, equal to or greater than about $1\times10^{10} \Omega$, or equal to or greater than about $1\times10^{11} \Omega$. This can be calculated for a housing 610 having a thickness of one millimeter across a surface area of 100 square millimeters.

An electrically conductive element 616 can be disposed, positioned, placed, or formed inside of the housing 610. In some implementations, the electrically conductive element 616 can include a metal sheet, metal antenna, or other electrically conductive piece. For example, a stamped metal sheet may be embedded in an injection-molded plastic. Conventional metal injection molding processes can be utilized to embed a stamped metal sheet in the housing 610. In some implementations, a material of the electrically conductive element 616 has an electrical resistivity equal to or less than about $1\times10^{-3}$ $\Omega$-m, equal to or less than about $1\times10^{-4}$ $\Omega$-m, equal to or less than about $1\times10^{-5}$ $\Omega$-m, equal to or less than about $1\times10^{-6}$ $\Omega$-m, or equal to or less than about $1\times10^{-7}$ $\Omega$-m at twenty degrees Celsius. The metal sheet, metal antenna, or other electrically conductive piece in the housing 610 is closer than the sensor electrode 646 to the outer surface 610b of the housing 610.

The sensor electrode 646 is separated from the outer surface 610b of the housing 610 by a separation distance, where the separation distance can include at least a thickness of the housing 610. It will be understood that a thickness of the housing 610 can be non-uniform, and so the thickness of the housing 610 can refer to a minimum thickness of the housing 610 or a thickness corresponding to a portion of the housing 610 directly between the sensor electrode 646 and the outer surface 610b. Design constraints or preferences may influence the separation distance of the sensor electrode 646 from the outer surface 610b of the housing 610. In some implementations, the separation distance is between about 0.5 millimeters and about five millimeters, between about 0.75 millimeters and about four millimeters, or between about one millimeter and about three millimeters.

The sensor electrode 646 can be electrically connected to the electrically conductive element 616 that is at least partially embedded in the housing 610. In some implementations, the electrically conductive element 616 can further include a metal rod, metal wire, or other electrically conductive piece in the housing 610 that extends to the inner surface 610a of the housing 610. The sensor electrode 646 may be disposed on the inner surface 610a of the housing 610 and electrically connected to the electrically conductive element 616. Because the electrically conductive element 616 is closer to the outer surface 610b of the housing 610, the sensor electrode 646 is effectively extended closer to the outer surface 610b to increase the sensitivity and range over which an object can be detected by the capacitive sensor 640. In some implementations, a surface area of the electrically conductive element 616 is larger than a surface area of the sensor electrode 646. This effectively increases the surface area or size of the sensor electrode 646 to increase the sensitivity and range over which an object can be detected by the capacitive sensor 640.

The sensitivity and range over which an object can be detected by the capacitive sensor 640 can be limited by the sensor electrode 646 having a relatively small surface area, the processor 632 of the controller 630 having a relatively low clock rate, and a thickness of the housing 610 resulting in a relatively large separation distance between the sensor electrode 646 and the outer surface 610b of the housing 610. However, the sensor electrode 646 being electrically connected with an electrically conductive element 616 embedded in the housing 610 increases the sensitivity and range over which an object can be detected by effectively extending the sensor electrode 646 closer to the outer surface 610b of the housing 610.

The various illustrative logical blocks, modules, circuits, and algorithm operations described in connection with the embodiments disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the various embodiments.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

The functions in the various embodiments may be implemented in hardware, software, firmware, or any combination thereof. If implemented in software, the functions may be stored as one or more instructions or code on a non-transitory computer-readable medium or non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the scope of the claims. Thus, the present disclosure is not intended to be limited to the embodiments shown herein but is to be accorded the widest scope consistent with the following claims and the principles and novel features disclosed herein.

What is claimed is:

1. An electronic device comprising:
    a capacitive sensor including a capacitor having at least one sensor electrode;
    a housing that encloses the capacitive sensor and having an inner surface and an outer surface opposite the inner surface, wherein at least a first portion of the housing includes an electrically insulating material and at least a second portion of the housing includes a partially conductive material, wherein the at least one sensor electrode is in conductive contact with the second portion of the housing and separated from the outer surface by the housing; and
    a controller coupled to the capacitive sensor, wherein:
        the controller is configured to determine whether the electronic device is in contact or in close proximity to an object based at least in part on a rate of capacitance charge of the capacitor when the capacitive sensor is energized,
        when the controller determines the electronic device is in contact or in close proximity to an object, the controller activates an active power mode of the electronic device, and
        when the controller determines the electronic device is not in contact or in close proximity to an object, the controller activates a low-power mode of the electronic device.

2. The electronic device of claim 1, wherein the at least one sensor electrode is disposed on the inner surface of the housing.

3. The electronic device of claim 1, wherein the capacitive sensor further includes:
    a resistor electrically connected in series with the capacitor, wherein the controller is configured apply a signal to the resistor to energize the capacitive sensor.

4. The electronic device of claim 3, wherein an electrical resistance of the resistor is at least five times greater than an electrical resistance of the partially conductive material of the second portion of the housing.

5. The electronic device of claim 3, wherein the partially conductive material of the second portion of the housing has an electrical resistance equal to or less than $1 \times 10^5 \, \Omega$ and the resistor has an electrical resistance equal to or greater than $5 \times 10^5 \, \Omega$.

6. The electronic device of claim 3, wherein the controller is further configured to:
    receive a signal from the capacitive sensor after energizing the capacitive sensor; and
    determine whether the electronic device is in contact or in close proximity to the object based at least in part on the received signal.

7. The electronic device of claim 1, wherein the controller includes a processor having a clock rate that is less than about 100 Megahertz.

8. The electronic device of claim 1, wherein the electrically insulating material of the first portion of the housing includes non-conductive plastic.

9. The electronic device of claim 1, wherein the partially conductive material of the second portion of the housing includes carbon-impregnated plastic.

10. The electronic device of claim 1, wherein the at least one sensor electrode is separated from the outer surface of the housing by a separation distance, the separation distance being between about 0.5 millimeters and about five millimeters.

11. The electronic device of claim 1, wherein the at least one sensor electrode has a surface area of between about nine square millimeters and about 225 square millimeters.

12. The electronic device of claim 1, wherein the at least one sensor electrode is separated from the outer surface of the housing by at least a thickness at the second portion of the housing.

13. An electronic device comprising:
    a capacitive sensor including a capacitor having at least one sensor electrode;
    a housing that encloses the capacitive sensor and having an inner surface and an outer surface opposite the inner surface, wherein the housing includes an electrically insulating material, wherein the at least one sensor electrode is separated from the outer surface by the housing;
    an electrically conductive element disposed on the inner surface of the housing and in conductive contact with the at least one sensor electrode; and
    a controller coupled to the capacitive sensor, wherein:
        the controller is configured to determine whether the electronic device is in contact or in close proximity to an object based at least in part on a rate of capacitance charge of the capacitor when the capacitive sensor is energized,
        when the controller determines the electronic device is in contact or in close proximity to an object, the controller activates an active power mode of the electronic device, and
        when the controller determines the electronic device is not in contact or in close proximity to an object, the controller activates a low-power mode of the electronic device.

14. The electronic device of claim 13, where the electrically conductive element has a surface area greater than a surface area of the at least one sensor electrode.

15. The electronic device of claim 13, wherein the electrically conductive element is an electrically conductive paint coated on the inner surface of the housing.

16. The electronic device of claim 13, wherein the capacitive sensor further includes:
    a resistor electrically connected in series with the capacitor, wherein the controller is configured apply a signal to the resistor to energize the capacitive sensor.

17. The electronic device of claim 13, wherein the at least one sensor electrode has a surface area between about nine square millimeters and about 225 square millimeters, and wherein the at least one sensor electrode is separated from the outer surface by a distance that is between about 0.5 millimeters and about five millimeters.

18. An electronic device comprising:
    a capacitive sensor including a capacitor having at least one sensor electrode;

a housing that encloses the capacitive sensor and having an inner surface and an outer surface opposite the inner surface, wherein the housing includes an electrically insulating material, wherein the at least one sensor electrode is separated from the outer surface by the housing;

an electrically conductive element at least partially embedded in the housing and electrically connected to the at least one sensor electrode; and a controller coupled to the capacitive sensor, wherein:
the controller is configured to determine whether the electronic device is in contact or in close proximity to an object based at least in part on a rate of capacitance charge of the capacitor when the capacitive sensor is energized,
when the controller determines the electronic device is in contact or in close proximity to an object, the controller activates an active power mode of the electronic device, and
when the controller determines the electronic device is not in contact or in close proximity to an object, the controller activates a low-power mode of the electronic device.

19. The electronic device of claim 18, wherein the electrically conductive element has a surface area greater than a surface area of the at least one sensor electrode.

20. The electronic device of claim 18, wherein the electrically conductive element is closer to the outer surface of the housing than the at least one sensor electrode.

21. The electronic device of claim 18, wherein the capacitive sensor further includes:

a resistor electrically connected in series with the capacitor, wherein the controller is configured apply a signal to the resistor to energize the capacitive sensor.

22. The electronic device of claim 18, wherein the at least one sensor electrode has a surface area of between about nine square millimeters and about 225 square millimeters, and wherein the at least one sensor electrode is separated from the outer surface by a distance that is between about 0.5 millimeters and about five millimeters.

* * * * *